(12) United States Patent
Kim et al.

(10) Patent No.: US 10,932,385 B1
(45) Date of Patent: Feb. 23, 2021

(54) MEDIA WALL

(71) Applicant: LG ELECTRONICS INC., Seoul (KR)

(72) Inventors: Yunjoo Kim, Seoul (KR); Jaemyo Shim, Seoul (KR); Junghan Ryu, Seoul (KR); Yanghwan No, Seoul (KR); Taeho Kim, Seoul (KR); Juyoung Choi, Seoul (KR); Youngkyoung Kim, Seoul (KR); Hyunki Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/744,104

(22) Filed: Jan. 15, 2020

(30) Foreign Application Priority Data

Oct. 4, 2019 (KR) .................. 10-2019-0122795

(51) Int. Cl.
*H05K 3/00* (2006.01)
*H05K 5/03* (2006.01)
(Continued)

(52) U.S. Cl.
CPC .............. *H05K 5/03* (2013.01); *E04B 2/58* (2013.01); *H05K 5/0017* (2013.01); *H05K 5/0217* (2013.01); *G09G 3/001* (2013.01)

(58) Field of Classification Search
CPC ..................................................... H05K 3/287
See application file for complete search history.

(56) References Cited

U.S. PATENT DOCUMENTS 6,901,987 B1   6/2005 Graham
10,410,549 B1 * 9/2019 Kim ................. H01L 51/5237
(Continued)

FOREIGN PATENT DOCUMENTS

JP    H06123919    5/1994
JP    H11193680    7/1999
(Continued)

OTHER PUBLICATIONS

PCT International Application No. PCT/KR2019/013118, Notification of Transmittal of the International Search Report and the Written Opinion of the International Searching Authority, or Declaration dated Jul. 2, 2020, 10 pages.
(Continued)

*Primary Examiner* — Jerry Wu
(74) *Attorney, Agent, or Firm* — Lee, Hong, Degerman, Kang & Waimey

(57) ABSTRACT

Disclosed herein is a media wall including a frame structure including a mounting cell, an electronic appliance disposed in the mounting cell, a drive roller arranged above the mounting cell, a screen wound around the drive roller by half a turn, the screen including a first region and a second region positioned, a motor configured to provide rotational force to the drive roller to vary an area of the first region, and a protruding frame introduced into and drawn out of the mounting cell, wherein, when the screen is in a first state, the first region is widened to cover the electronic appliance, and the protruding frame protrudes forward and contacts the first region of the screen, wherein, when the screen is in a second state, the first region is narrowed to expose the electronic appliance, and the protruding frame retreats rearward and is spaced apart from the screen.

11 Claims, 18 Drawing Sheets

(51) Int. Cl.
    *H05K 5/00*     (2006.01)
    *E04B 2/58*     (2006.01)
    *H05K 5/02*     (2006.01)
    *G09G 3/00*     (2006.01)

(56) References Cited

U.S. PATENT DOCUMENTS

2007/0209251 A1    9/2007  Zheng et al.
2019/0138058 A1*  5/2019  Kwon ..................... G09G 3/22

FOREIGN PATENT DOCUMENTS

| | | |
|---|---|---|
| JP | 3183677 | 5/2013 |
| JP | 2018168611 | 11/2018 |
| KR | 1020120050419 | 5/2012 |
| WO | 2018053488 | 3/2018 |

OTHER PUBLICATIONS

European Patent Office Application Serial No. 201584745, Search Report dated Oct. 6, 2020, 10 pages.

* cited by examiner (a)                    (b)

FIG. 6
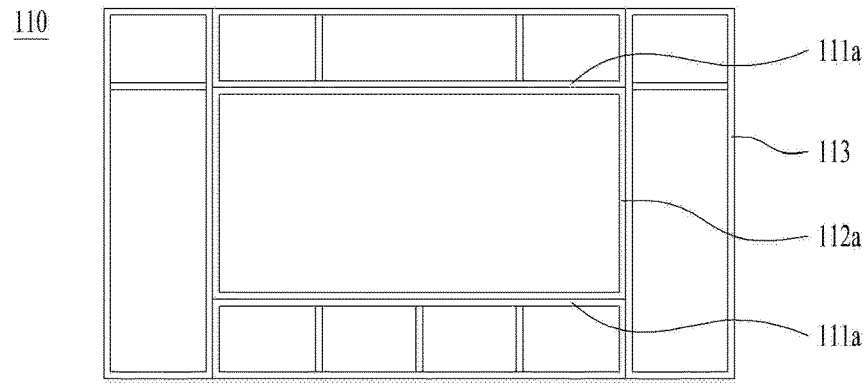
(a)
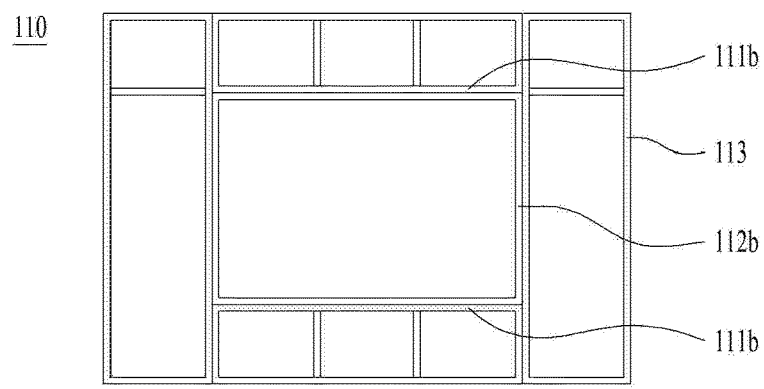
(b)
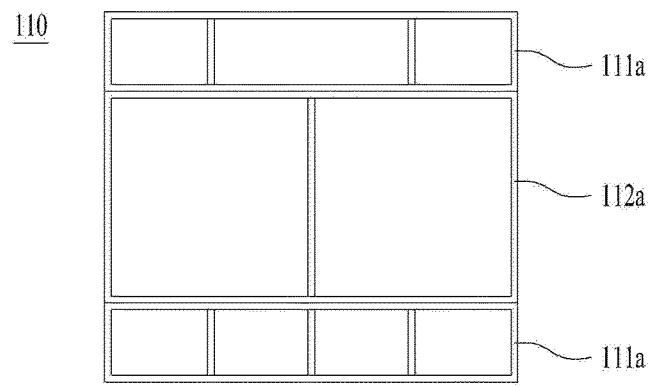
(c)

FIG. 9
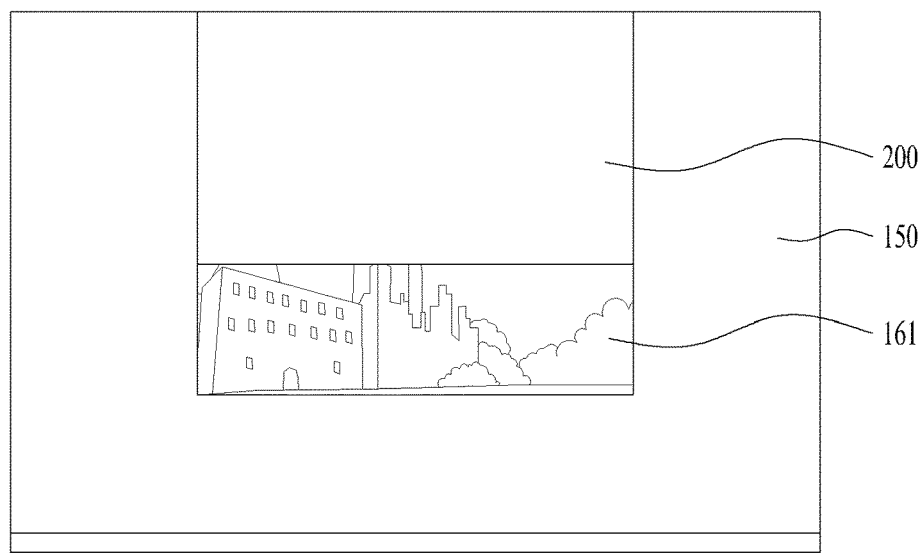
(a)
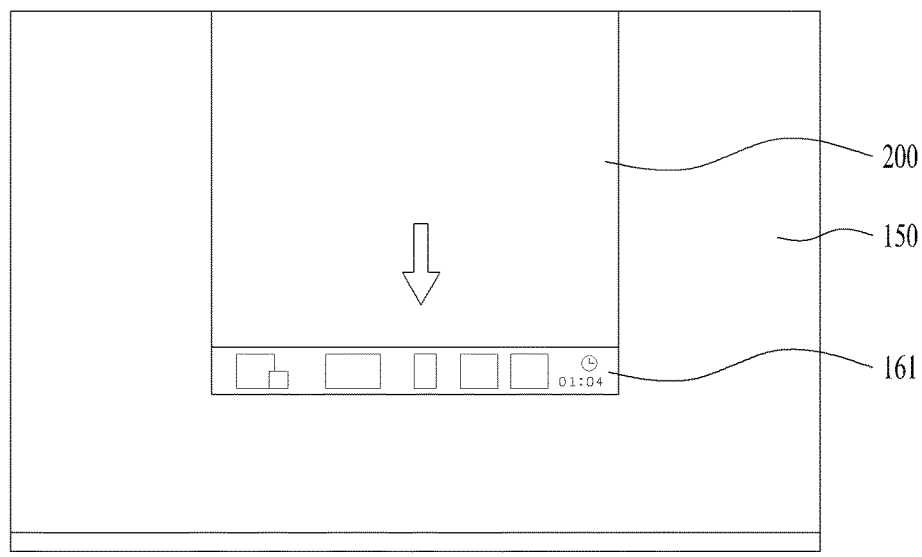
(b)

FIG. 10
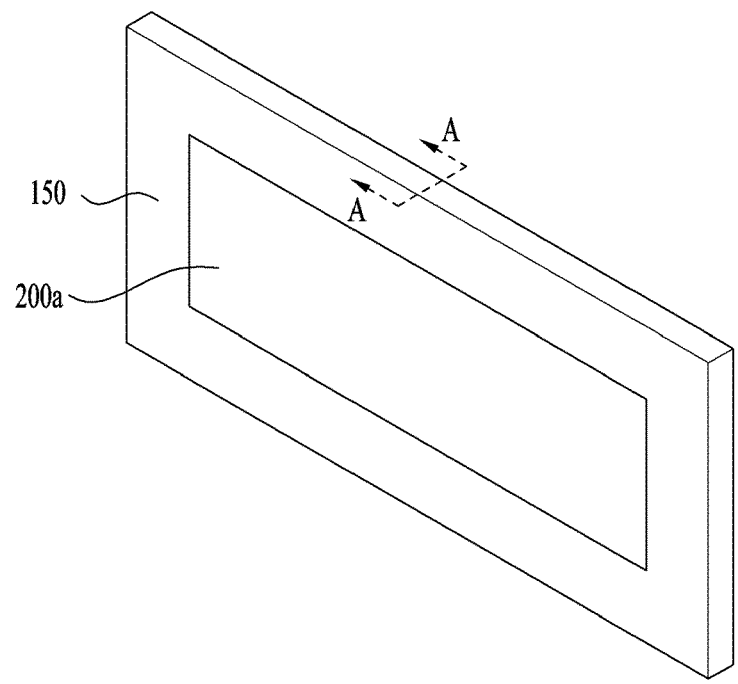
(a)
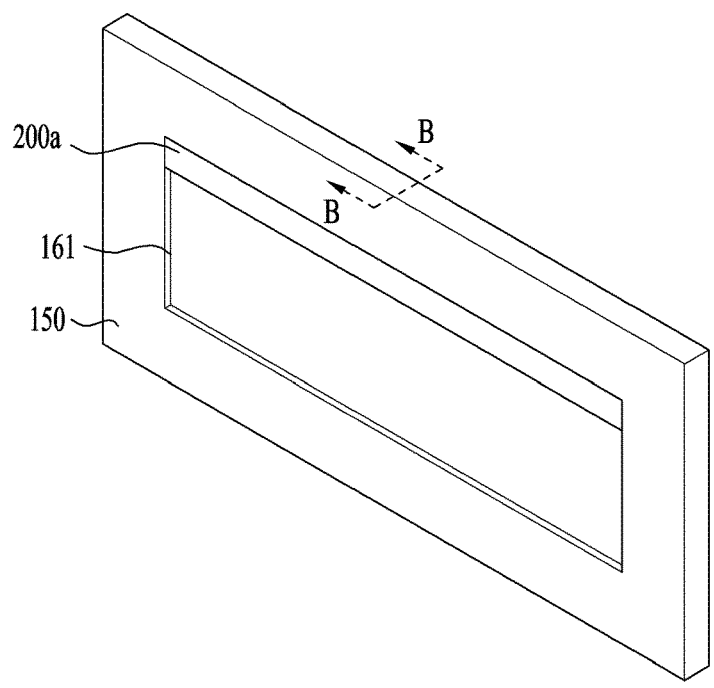
(b)

FIG. 12
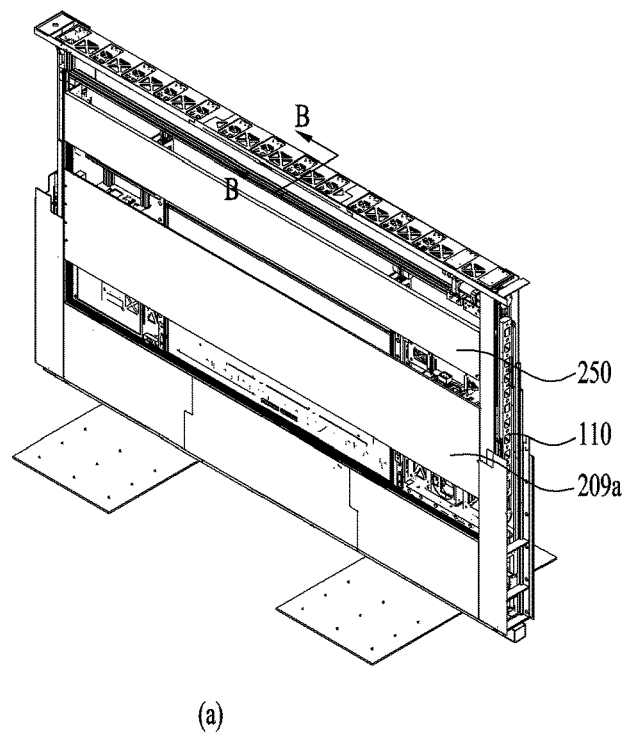
(a)
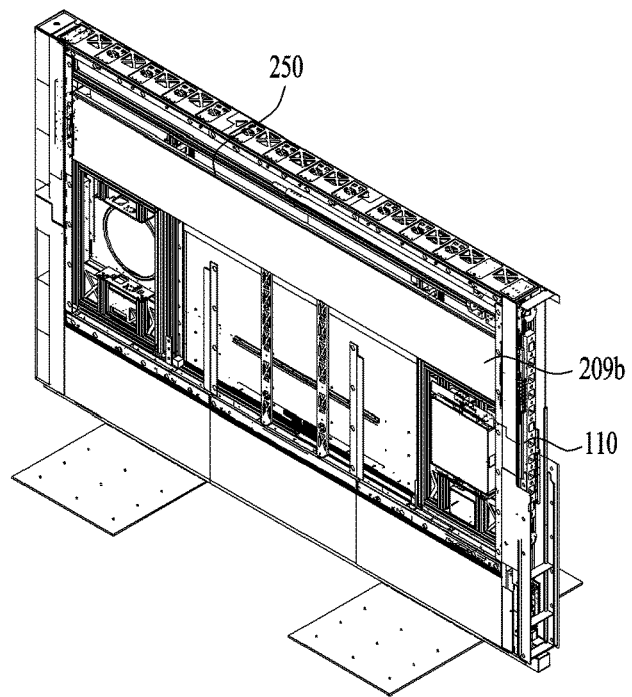
(b)

FIG. 14
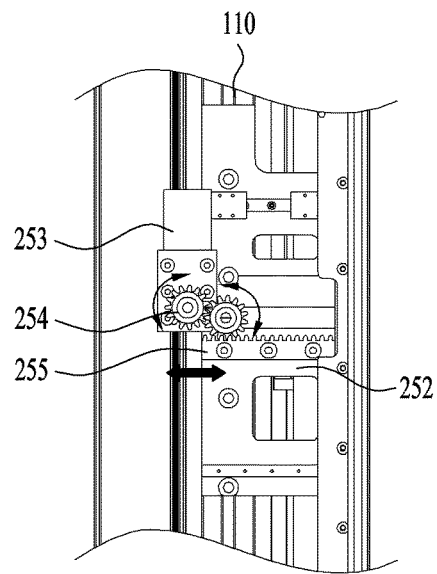
(a)
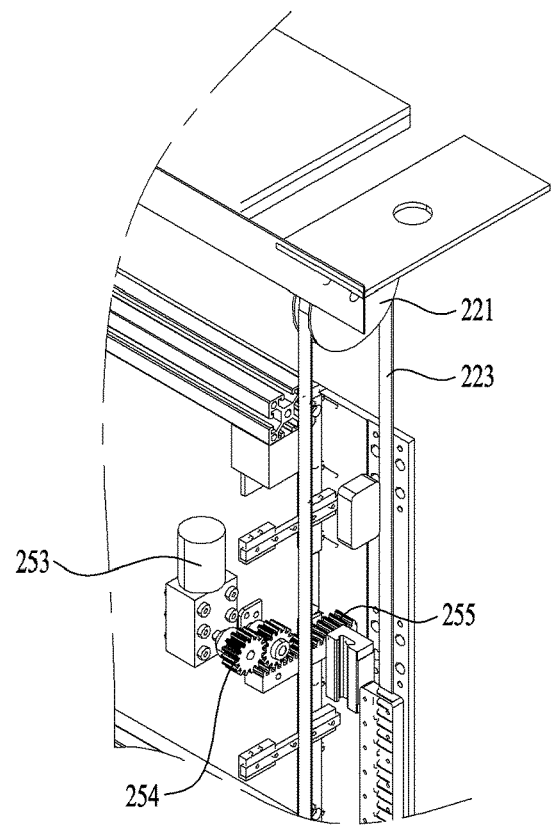
(b)

FIG. 18
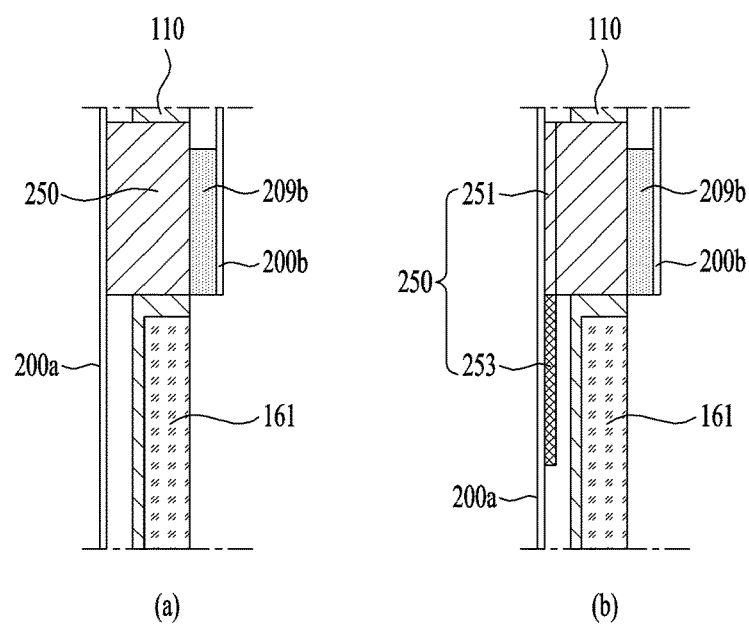
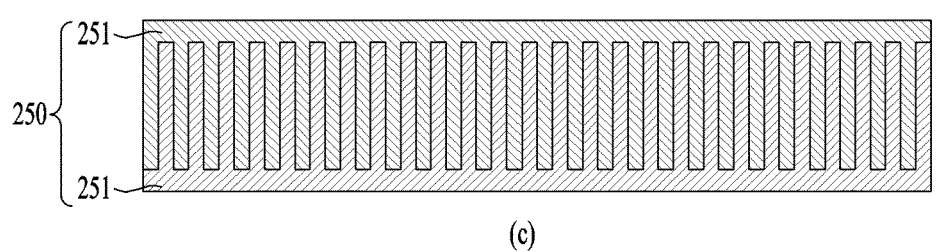
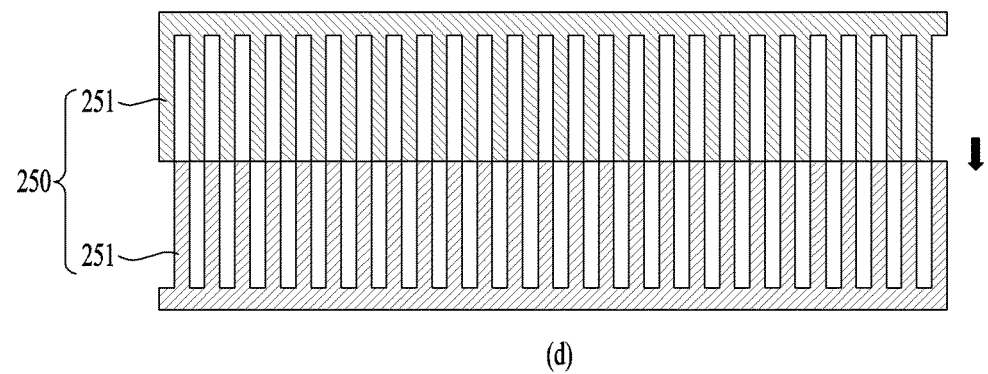

MEDIA WALL

CROSS-REFERENCE TO RELATED APPLICATIONS

Pursuant to 35 U.S.C. § 119(a), this application claims the benefit of earlier filing date and right of priority to Korean Patent Application No. 10-2019-0122795, filed on Oct. 4, 2019, the contents of which are all hereby incorporated by reference herein in its entirety.

BACKGROUND

Field

The present disclosure relates to a wall on which a multimedia device, such as a TV and a loudspeaker, and a home appliance are mounted, and a unitized media wall.

Discussion of the Related Art

Recently, as the infrastructure in which all media devices and home appliances at home beyond the smartphone are connected to the Internet is built, the smart home is emerging as a keyword of a new smart ecosystem. In particular, user experiences and values accumulated through smartphones, which are personal media devices, have begun to extend to other devices.

As various attempts such as building a home network system were made in order to make media devices and home appliances to interoperate with each other, the number of electronic devices at home has increased and there is a hassle of connecting the devices one by one.

In particular, it is a recent trend to minimize the number of pieces of furniture and electronics that are placed near the living room wall, around which the TV is usually placed, to keep a neat appearance of the living room wall, which represents the house. In addition, where there are children in a house, they may be pushed over or bumped and injured due to a TV table or a loudspeaker placed in the living room. Therefore, it is important to reduce the number of pieces of furniture and electronics protruding into the space of the living room.

In order to minimize the number of pieces of furniture exposed to the outside, a screen to cover the front of a device occupying a large area such as a TV may be used to cover the device when the device is not in use. The screen may be optionally formed of a flexible material so as to be placed on the front of the TV, but a structure to maintain the screen in a flat position may be needed to allow the screen to have an appearance similar to that of the art wall thereaournd to provide a unified appearance.

SUMMARY OF THE DISCLOSURE

The present disclosure is directed to a wall on which multimedia devices, such as a TV and a loudspeaker, and home appliances are mounted, and an object of the present disclosure is to provide a structure for supporting a screen located on the front of a unitized media wall.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In one aspect of the present disclosure, a media wall may include a frame structure including a mounting cell, an electronic appliance disposed in the mounting cell, a drive roller arranged above the mounting cell, a screen wound around the drive roller by half a turn, the screen including a first region positioned in front of the electronic appliance and a second region positioned behind the electronic appliance, a motor configured to provide rotational force to the drive roller to vary an area of the first region of the screen, and a protruding frame introduced into and drawn out of the mounting cell in a back-and-forth direction, wherein, when the screen is in a first state, the first region is widened to cover the electronic appliance, and the protruding frame protrudes forward and contacts the first region of the screen, wherein, when the screen is in a second state, the first region may narrowed to expose the electronic appliance, and the protruding frame may retreat rearward and is spaced apart from the screen.

The frame structure may include a vertical frame positioned on left and right sides of the mounting cell, and the media wall may further include a frame motor positioned on the vertical frame, a pinion gear configured to be rotated by rotational force of the frame motor transmitted thereto, and a rack gear formed on the protruding frame and configured to rotate in engagement with the pinion gear.

The media wall may further include a first screen plate positioned at a lower end of the first region of the screen.

The media wall may further include a guide rail formed on the frame structure and extending in a vertical direction, and a movement guide extending from the first screen plate and configured to move along the guide rail.

The first screen plate may have a thickness corresponding to a distance between the frame structure and the screen.

When the screen is switched from the first state to the second state, the protruding frame may move rearward a distance greater than or equal to the thickness of the first screen plate.

The media wall may further include a second screen plate having a thickness corresponding to the distance between the frame structure and the screen and positioned at a lower end of the second region.

The protruding frame may include a first inclined surface facing the first screen plate and a second inclined surface facing the second screen plate, the first inclined surface and the second inclined surface being formed at a lower end of the protruding frame, wherein, when the first region is narrowed and an upper end of the first screen plate comes into contact with the first inclined surface, the protruding frame may be moved rearward, and wherein, when the second region is narrowed and an upper end of the second screen plate comes into contact with the second inclined surface, the protruding frame may be moved forward.

The media wall may further include a third inclined surface provided to an upper end of the first screen plate, the third inclined surface extending downward and rearward, and a fourth inclined surface provided to an upper end of the second screen plate, the fourth inclined surface extending downward and forward, wherein, when the first region is narrowed and a lower end of the protruding frame comes into contact with the third inclined surface, the protruding frame may be moved rearward, and wherein, when the second region is narrowed and the lower end of the protruding frame comes into contact with the fourth inclined surface, the protruding frame may be moved forward.

The protruding frame may further include an extension frame extending downward in the first state.

The protruding frame may have a width corresponding to a horizontal width of the screen.

A media wall according to the present disclosure may be installed on a wall at the same height as a multimedia device such as a TV or an audio device mounted thereon and may cover the electronic appliances with a screen when the electronic appliances are not in use. Thereby, the media wall may provide a tidy appearance.

As a screen to selectively expose a display device according to a usage status of the display device is used, a tidier appearance may be provided.

In particular, as a protruding frame is used, the screen may be maintained in a flat position, an appearance similar to that of the art wall may be implemented.

Further scope of applicability of the present disclosure will become apparent from the detailed description below. Various changes and modifications within the spirit and scope of the present disclosure may be clearly understood by those skilled in the art, and therefore, the detailed description and specific embodiments, such as preferred embodiments of the present disclosure, should be understood as given by way of example only.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 6 is a view illustrating a frame module of the media wall according to an embodiment of the present disclosure;

FIG. 9 is a view illustrating change of a screen view according to the size of a display exposed through the front of the media wall according to an embodiment of the present invention;

FIG. 10 is a view illustrating operation of a screen of the media wall;

FIG. 12 is a view illustrating the frame structure and the protruding frame, which are exposed by removing the screen in the state of FIG. 10;

FIG. 14 is a view illustrating a frame driver;

FIGS. 16 to 18 are views illustrating various embodiments of the protruding frame of the media wall.

DETAILED DESCRIPTION OF THE DISCLOSURE

Hereinafter, exemplary embodiments disclosed herein will be described in detail with reference to the accompanying drawings. The same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In the following description of the embodiments of the present disclosure, a detailed description of known technology will be omitted to avoid obscuring the subject matter of the present disclosure. The accompanying drawings are intended to facilitate understanding of the embodiments disclosed herein, and should not be construed as limiting the technical idea disclosed in the present specification. The disclosure is to cover all modifications, equivalents, and alternatives falling within the spirit and scope of the embodiments.

Terms including ordinal numbers such as first, second, etc. may be used to explain various elements. However, it will be appreciated that the elements are not limited to such terms. These terms are merely used to distinguish one element from another.

Stating that one constituent is "connected" or "linked" to another should be understood as meaning that the one constituent may be directly connected or linked to another constituent or another constituent may be interposed between the constituents. On the other hand, stating that one constituent is "directly connected" or "directly linked" to another should be understood as meaning that no other constituent is interposed between the constituents.

As used herein, the singular forms "a", "an", and "the" include plural referents unless context clearly dictates otherwise.

In this specification, terms such as "includes" or "has" are intended to indicate existence of characteristics, figures, steps, operations, constituents, components, or combinations thereof disclosed in the specification. The terms "includes" or "has" should be understood as not precluding possibility of existence or addition of one or more other characteristics, figures, steps, operations, constituents, components, or combinations thereof.

Figure 1:
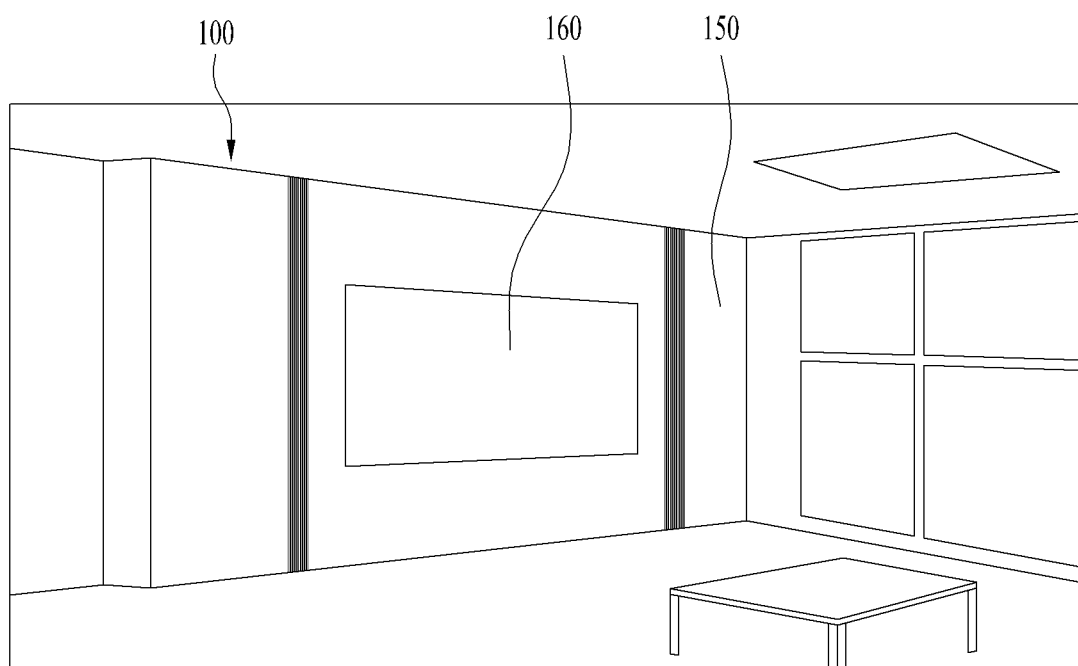
FIG. 1 is a view illustrating an installation example of a media wall of the present disclosure.

FIG. 1 is a view showing a wall-type frame of a media wall 100 of the present disclosure. The present disclosure relates to a media wall 100 systemized by integrating electronic devices used at home, such as media devices and home appliances, with a wall so as not to be exposed through the exterior of the media wall. The present disclosure provides a total space solution that minimizes the exposure of electronic devices in a space by mounting various electronic devices such as a display, an interphone, a loudspeaker, an air purifier, a humidifier, a light, a digital clock, a router, and a set-top box on a wall.

Recently, the thickness of a display device 161 has become thin. Thus, the media wall 100 of the present disclosure may be formed to have a thickness of 15 to 20 cm, thereby preventing the interior space from being narrowed during installation. Rather, the storage furniture and a home appliance 160 may be embedded in the media wall 100 to provide a neat appearance. When necessary, a part of the wall may be selectively drawn out to allow a necessary home appliance to protrude from the wall, and the space where the home appliances are not embedded may be used as a mounting cell 114 for an item such as a drawer.

Recently, it has become possible to design a thin TV, and thus a thin display is implementable. Accordingly, the TV itself may serve as a cover of a frame and may be coupled to the frame to define a front appearance. An opening 153 may be formed in an art wall 151 to expose the display of the display device 161. A cover to open and close the opening 153 may be further provided.

A display employing organic light-emitting diodes (OLED) is bendable, and therefore it may be exposed to the outside only when used and may be rolled up and kept inside the wall when not in use, thereby providing a tidy screen by appearance.

Regarding projectors, a unifocal projector has recently been developed. This projector may be mounted on the wall and drawn out like a drawer to output images on a screen, thereby implementing a large screen. In this case, when the projector is in use, the display is unseeable from the outside of the media wall 100, and therefore may provide a tidier appearance.

Figure 2:
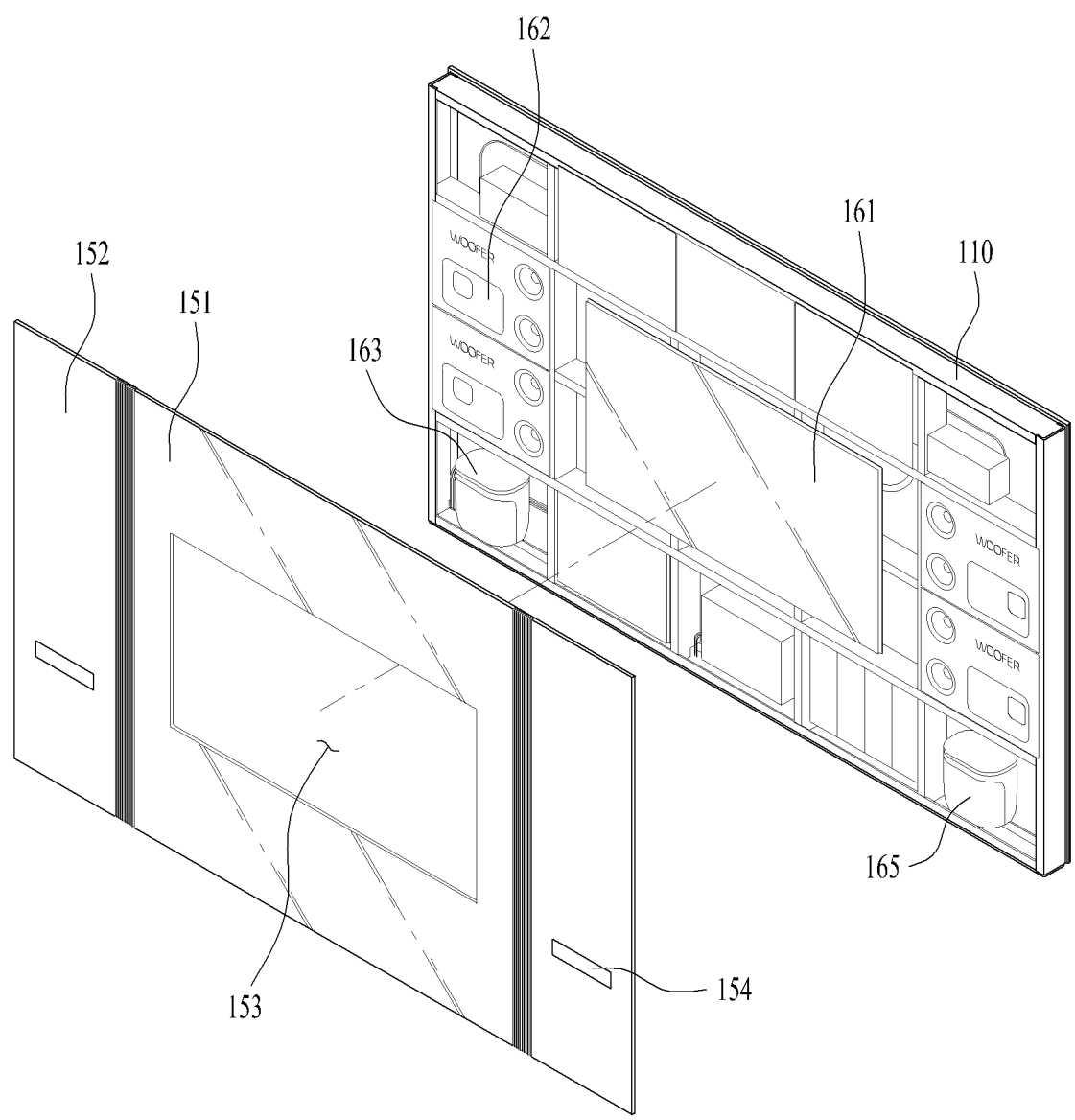
FIG. 2 is an exploded perspective view of the media wall according to an embodiment of the present disclosure.
Figure 3:
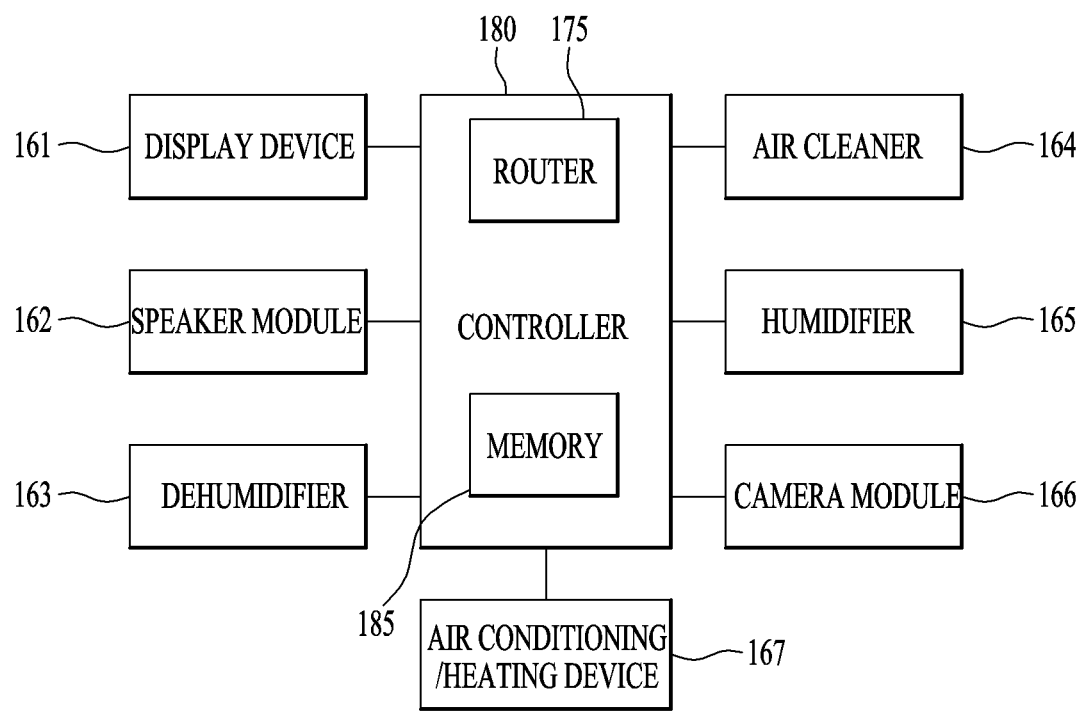
FIG. 3 is a block diagram of the media wall according to an embodiment of the present invention.

FIG. 2 is an exploded view of the media wall 100 of the present disclosure, and FIG. 3 is a block diagram of the media wall 100 according to the present invention. A frame structure formed by a plurality of pieces of shape steel arranged in a grid form may be disposed inside the art wall 150, which is on the front. The frame structure 110 is a rigid member. The frame structure 110 may support the wall so as not to collapse even when an impact is applied to the wall. A panel may be attached to the front of the frame structure 110 to hide the electronic appliance 160 mounted on the frame structure 110, thereby looking like a wall. The front wall covered with such a panel is called an art wall 150.

The art wall 150 may be changed according to the preference of the consumer. The art wall 150 may be easily changed after being installed to change the mood of the home.

The shape steel 115 arranged in a grid form may partition the mounting cell 114, and seat the electronic appliance 160 in each of the partitioned mounting cells 114. The partitioned mounting cells 114 may have the same size or sizes which are multiples of a size. Thus, the electronic appliance 160 to be mounted may be modularized and disposed at any position in the frame structure 110.

In addition to the display device 161 described above, a sound device 162 such as a loudspeaker may be mounted in the mounting cell 114. Multiple sound devices 162 may be configured according to the number of channels. The art wall 152 covering the sound device 162 may be configured in a mesh form to allow sound to be output, or may selectively open and close the openings through which the sound is output, such that the openings exposed to the art wall 152 are minimized. A waterproof mesh or the like may be used to prevent water from being introduced through the openings.

A dehumidifier 163, a humidifier 165, an air cleaner 164, and an air conditioning/heating device 167, such as an air conditioner or a stove, which are seasonal household appliances, may be provided. Leaving the seasonal appliances exposed to the outside when not in use may cause dust to accumulate on the appliances and undermine the appearance. Thus, the seasonal appliances are usually kept in a storage area with a cover put thereon when they are not in use. When such appliances are embedded in the media wall 100 as in the present disclosure, they may be covered with the art wall 150 so as not to be exposed to the outside in a period for which the appliances are not used. In other words, the need for a separate storage space may be eliminated.

The dehumidifier 163 or the humidifier 165 may implement a drawer type space for collecting/storing water to remove collected water or supply water. Openings 154 through which air passes are needed to discharge water or to collect moisture in the surroundings.

The openings 154 may not be necessarily formed in the art wall 150, but a gap between the art wall 150 and the frame structure 110 may be used.

The air cleaner 164 may include an openable cover configured to periodically replace a filter.

Each electronic product may be individually controlled, but the media wall may further include a controller 180 configured to integrally control the electronic appliances mounted on the media wall. The controller may have a memory 185 and thus may store collected data therein.

The dehumidifier, the humidifier, and the air cleaner 164 may be installed at a lower end of the media wall 100 to allow a user to easily manipulate the dehumidifier, the humidifier, and the air cleaner. In addition, when a set-top box or a Wi-Fi router 175 is provided, a home network system may be implemented. Not only functional units mounted on the media wall 100 but also other electronic devices such as a computer or a mobile terminal located outside the media wall 100 may be connected via the Wi-Fi router 175 for interworking. The media wall may further include a controller 180 configured to control each electronic appliance 160.

An LED or a small display panel may be arranged on an upper portion of the media wall 100 to provide a user with simple information such as weather, time, event information, or may be used as lighting. A light may be provided to the media wall 100 to obtain an interior effect.

When different communication schemes or signals are used between the devices, the router 175 serves as an intermediate device to coordinate the schemes or signals and guide a path. In addition, a functional unit mounted on the media wall 100 may be connected and controlled via the WIFI router 175, rather than being connected by wire.

The router 175 also serves to connect an external network and the internal network to each other. Accordingly, the user staying outside may control, via the router 175 connected to the external network, not only the electronic appliance 160 mounted on the media wall 100 but also other home appliances and media devices connected to the home network.

In addition, the controller 180 may control the electronic devices of the media wall 100 in operative connection with a mobile device. That is, when the mobile device is mounted on the media wall 100, media images and music on the mobile device may be output. In addition, when a video call is received through the mobile device, the controller may receive information from the mobile device by Bluetooth or Wi-Fi and output the image of the other party through the display device 161 of the media wall 100.

In addition, a wall pad connected to a camera or security system of the front door may be provided in the mounting cell 114 of the media wall 100. The wall pad embedded in the existing bearing wall is difficult to repair and replace in case of failure, and there is a difficulty in changing the location thereof. However, when the wall pad is configured in a unit form and provided in the media wall 100, maintenance thereof is easy.

The media wall 100 may be installed in a room as well as the living room. The wall between the rooms may be configured as the media wall 100 to use the media wall 100 in both directions in neighboring rooms. For example, one air conditioner or air purifier may be used in both spaces when it is arranged to be reachable in both directions. Instead of the TV and loudspeaker 162 used in the living room, a monitor and a personal computer (PC) may be mounted and used based on the purpose of the room. Alternatively, another functional unit such as an electronic board may be mounted and used according to the age of a child.

When installed in an office, a media wall 100 equipped with functional units such as an electronic board, an air purifier, a video conference system, and a PC may be used. The electronic appliance 160 mounted on the media wall 100 is covered by the art wall 150 and thus do not require a separate exterior case.

When the media wall 100 is installed after being manufactured at a factory according to a user's installation location, large quantities of the same module may be manufactured and supplied to a hotel/resort or apartment under construction, thereby reducing defect rate and manufacturing costs.

However, it is difficult to transport the media wall 100 that has been assembled. Further, when construction of a building is completed, it is difficult to bring the media wall 100 into the building. Accordingly, when the media wall 100 is installed at the time of movement into an existing building or remodeling of the interior, the media wall 100 may be implemented by installing a frame in the building and inserting a unit module. In this case, for ease of installation and standardization, the frame structure 110 may be implemented using a plurality of module frames.

Figure 4:
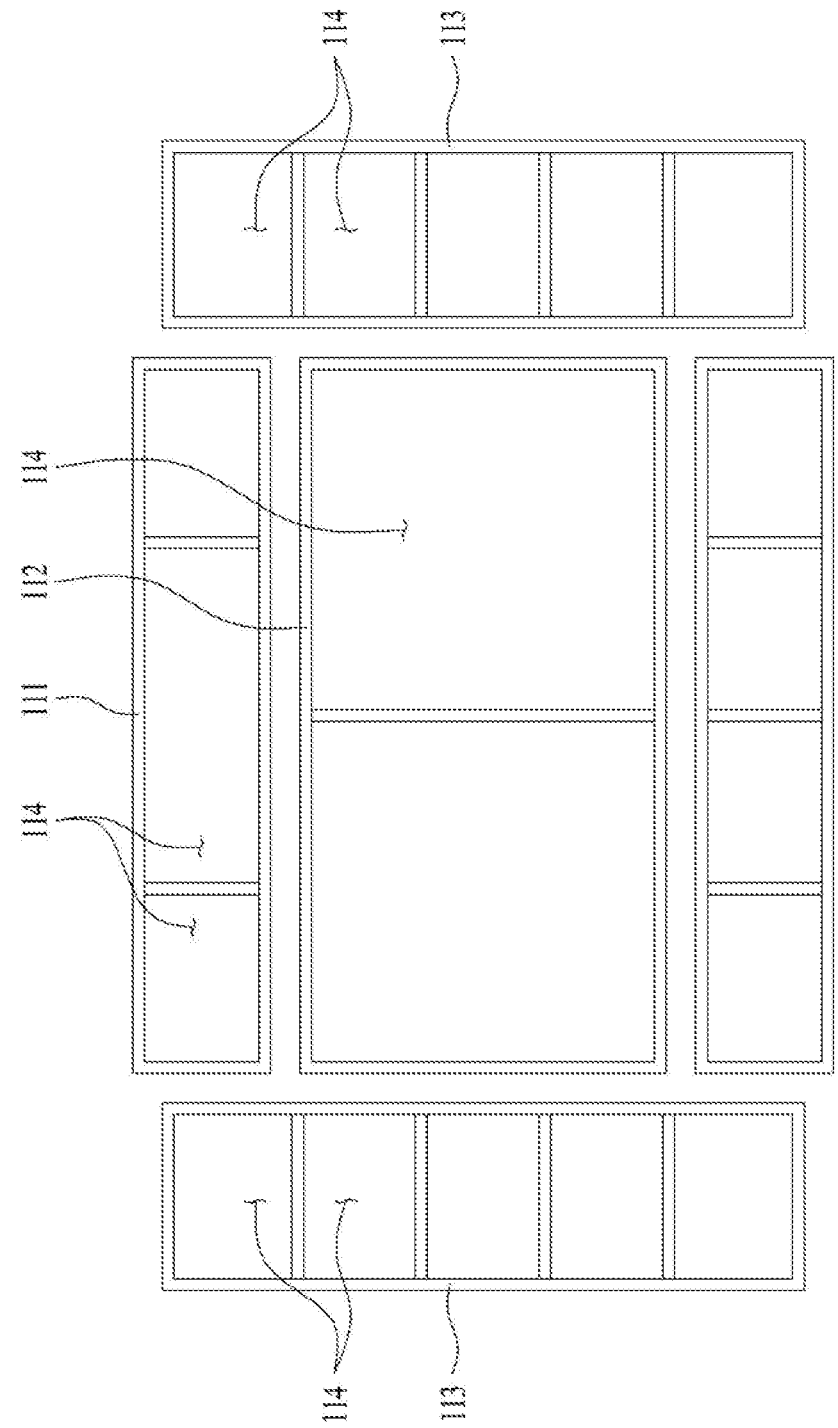
FIG. 4 is a view illustrating a configuration of frames of the media wall according to an embodiment of the present disclosure.

FIG. 4 is a view illustrating coupling of frame modules 111, 112, and 113 of the media wall 100 according to an embodiment of the present disclosure. In order to mount each component, bookcase-type frame modules 111, 112, and 113 including the mounting cell 114 may be used. In order to partition the mounting cell 114, the frame modules 111, 112, and 113 may be manufactured by arranging a plurality of pieces of beam-shaped shape steel 115 in a grid.

The frame modules 111, 112, and 113 may include a first frame module 111 having mounting cells 114 arranged side by side in a horizontal direction, a second frame module 112 provided to mount a large appliance 160 such as the display device 161, a third frame module 113 having mounting cells 114 arranged side by side in a vertical direction.

The second frame module 112 includes a large space to allow the display device 161 of any size to be mounted therein. When necessary, as shown in FIG. 4, beams to partition the mounting cell 114 may be provided to fix the display device 161 and to enhance rigidity of the frame structure 110.

The first frame module 111 and the second frame module 112 may be stacked in a vertical direction. The horizontal length of the first frame module 111 may be the same as the horizontal length of the second frame module 112. Thus, when the modules are stacked in the vertical direction, they may be disposed so as not to be misaligned.

The first frame module 111 may be disposed both over and under the second frame module 112. The number of first frame modules 111 stacked in the vertical direction may be increased or decreased depending on the sizes of the first frame module 111 and the second frame module 112 or the size of the installation space.

The third frame module 113, in which the mounting cells 114 are arranged side by side in the vertical direction, may have the same height as that of the first frame module 111 and the second frame module 112 stacked in the vertical direction. As shown in FIG. 4, the third frame module 113 may be located on the lateral sides of the first frame module 111 and the second frame module 112. The frame modules 111, 112, and 113 may be coupled with fasteners to form the frame structure 110 having a rectangular parallelepiped shape.

Figure 5:
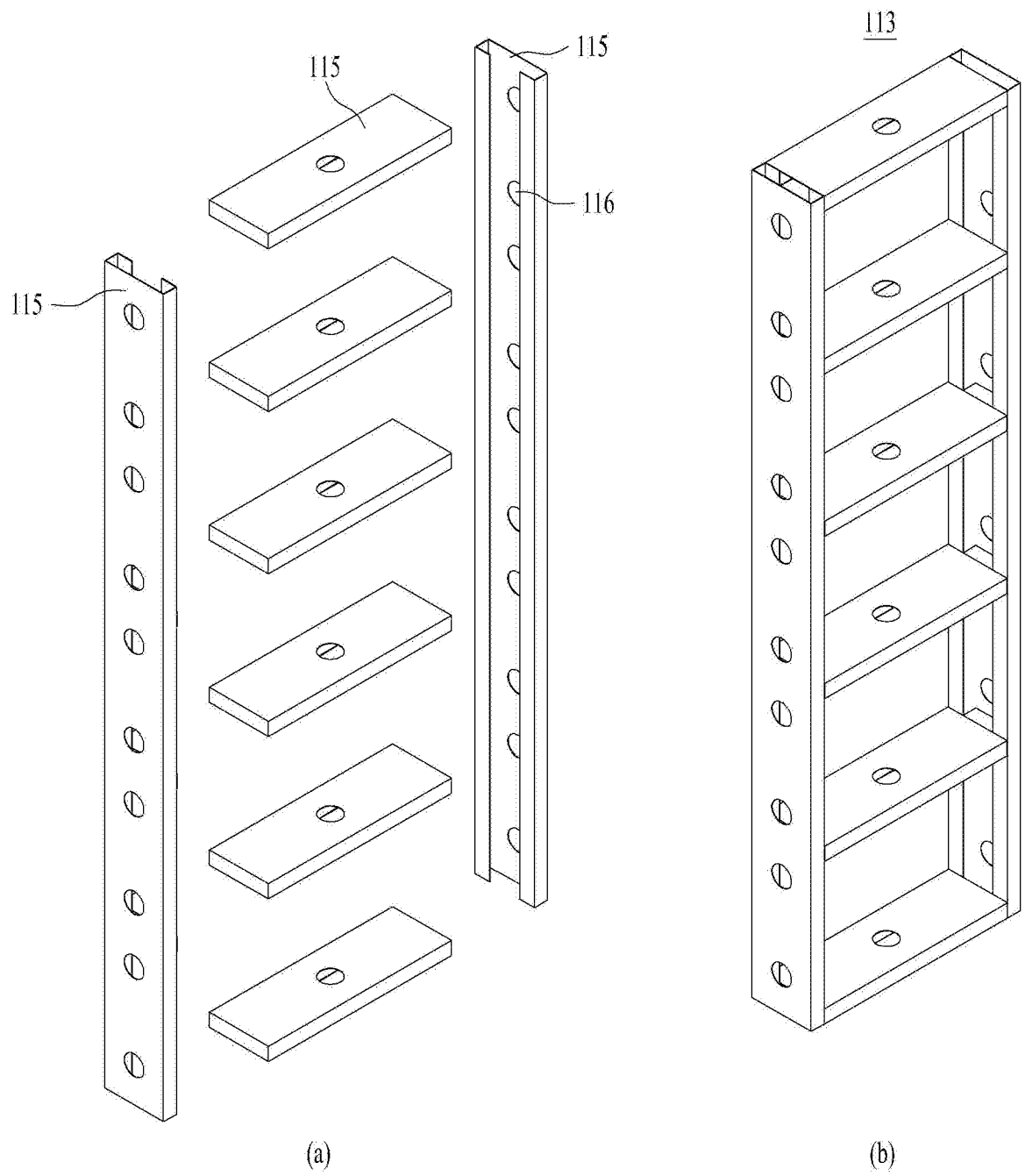
FIG. 5 shows examples of various frame structures according to a combination of frame modules of the present disclosure.

FIG. 5 is a view illustrating a method of manufacturing the frame modules 111, 112, and 113 of the present disclosure. The third frame module 113 in which the mounting cells 114 are arranged in the vertical direction will be described as an example. Each of the frame modules 111, 112, and 113 may be formed using the shape steel 115 extending in one direction. The shape steel is a structural member and represents all rod-shaped members having various cross-sectional shapes. Rod-shaped steel having the same cross section in the longitudinal direction may be formed by rolling or by bending a sheet material. The shape steel has a hollow space compared to a beam-shaped member having a circular or rectangular cross section. Thus, it is a lightweight member obtaining rigidity greater than or equal to a predetermined value with a little amount of material.

As shown in FIG. 5, the present disclosure may employ C-shape steel 115 having a C-shaped cross section. The C-shape steel 115 may be formed by vertically bending both width ends of a metal plate. When both ends of the metal plate are vertically bent only once, the plate may have a square bracket-shaped cross section. When both ends of the metal plate are vertically bent twice, the plate may have a C-shaped cross section. A power line or signal line connected to the electronic appliance 160 may be disposed in the internal space of the steel, and an outlet module 140 to which a power cable or a data cable is fastened may be disposed.

The outlet module 140 may include a power terminal for supplying power, a data terminal for data transmission and reception such as an Internet line or a cable input, and a connector by which a functional unit inserted into the frame is connected to another functional unit. The connector has terminals on both sides of the frame. When data connection lines of electronic devices are inserted into the terminals, the devices may exchange data with each other. The outlet module 140 may include a rail structure that moves along the frame modules 111, 112, and 113.

A vent hole 116 may be formed in the shape steel 115 as shown in FIG. 5. The vent hole 116 may reduce the weight of the shape steel 115 and discharge heat generated from the electronic appliance 160. A fan may also be used to discharge hot air to the outside to more actively discharge heat. When the heat of the electronic appliance 160 is discharged into an indoor space, a heating effect may be obtained in winter. However, in summer, discharging the heat into the indoor space may cause the indoor temperature to rise. Thus, the fan may be used to internally circulate heat, or a structure to discharge heat to the outside may be added to the wiring connected to the outdoor unit of the air conditioner.

Each of the frame modules 111, 112, and 113 may include outer steel defining a rectangular outer periphery and an inner steel arranged therein to partition the mounting cell 114. The outer steel may include vertical steel extending in the vertical direction and horizontal steel extending in the horizontal direction. The first frame module 111 to the third frame module 113 may be assembled by arranging the horizontal steel between a pair of vertical steels. In order to fasten the vertical steel with a fixing member 120, which is fixed to the ceiling and the floor, the upper and lower ends of the vertical steel may need to be exposed. Therefore, the vertical steel may be arranged outside the horizontal steel may be fastened by inserting vertical brackets 122 and 123 of the fixing member 120 to the end of the vertical steel.

The inner steel positioned inside the outer steel may define the mounting cell 114 by partitioning a space surrounded by the outer steel. The inner steel may be immovably connected to the outer steel by welding, and part of the inner steel may be bolted or hooked so as to be removed when necessary.

Thus, by fascinating the frame modules 111, 112, and 113 in the form of a semi-finished appliance 160 in the above-described manner, the number of connection operations to be performed on the site may be reduced. The dimensions of the appliance 160 may be kept constant and the installation time may be reduced. In addition, the product may be modularized into a size that facilitates movement of the product, and therefore may be easily moved to the site.

FIG. 6 shows examples of various frame structures 110 according to a combination of the frame modules 111, 112, 113 of the present disclosure. FIG. 6(*a*) illustrates assembly of a frame structure 110 consisting of a pair of first frame modules 111*a* of FIG. 4, one second frame module 112*a*, and a pair of third frame modules 113. Since the first frame module 111*a* has four mounting cells 114, the width of the first frame module 111*a* may not fit to a narrow indoor space for installation.

Accordingly, as shown in FIG. 6(*b*), a first frame module 111*b* having three mounting cells 114 to have a short horizontal length may be used. The second frame module 112*b* may have a length corresponding to the horizontal length of the first frame module 111*b*.

In addition, the third frame modules 113 may be disposed on both sides of the vertical stack of the first frame module 111 and the second frame module 112. The ceiling height of a typical house is 220 cm to 230 cm, the third frame module 113 may be configured to have a height a little less than 220 cm. While a five-stage vertical frame is illustrated in the drawings, a six-stage vertical frame may be manufactured in case of a multilayer house or a house having a great ceiling height.

When installed in a narrower space, the frame structure 110 may be configured using only the first frame module 111*a* and the second frame module 112*a* without the third frame module 113. When a large display device 161 is not mounted, only the third frame modules may be arranged in a line to implement the frame structure 110. Each frame module 111, 112, 113 may be fastened by bolts, or may be fastened by welding.

Figure 7:
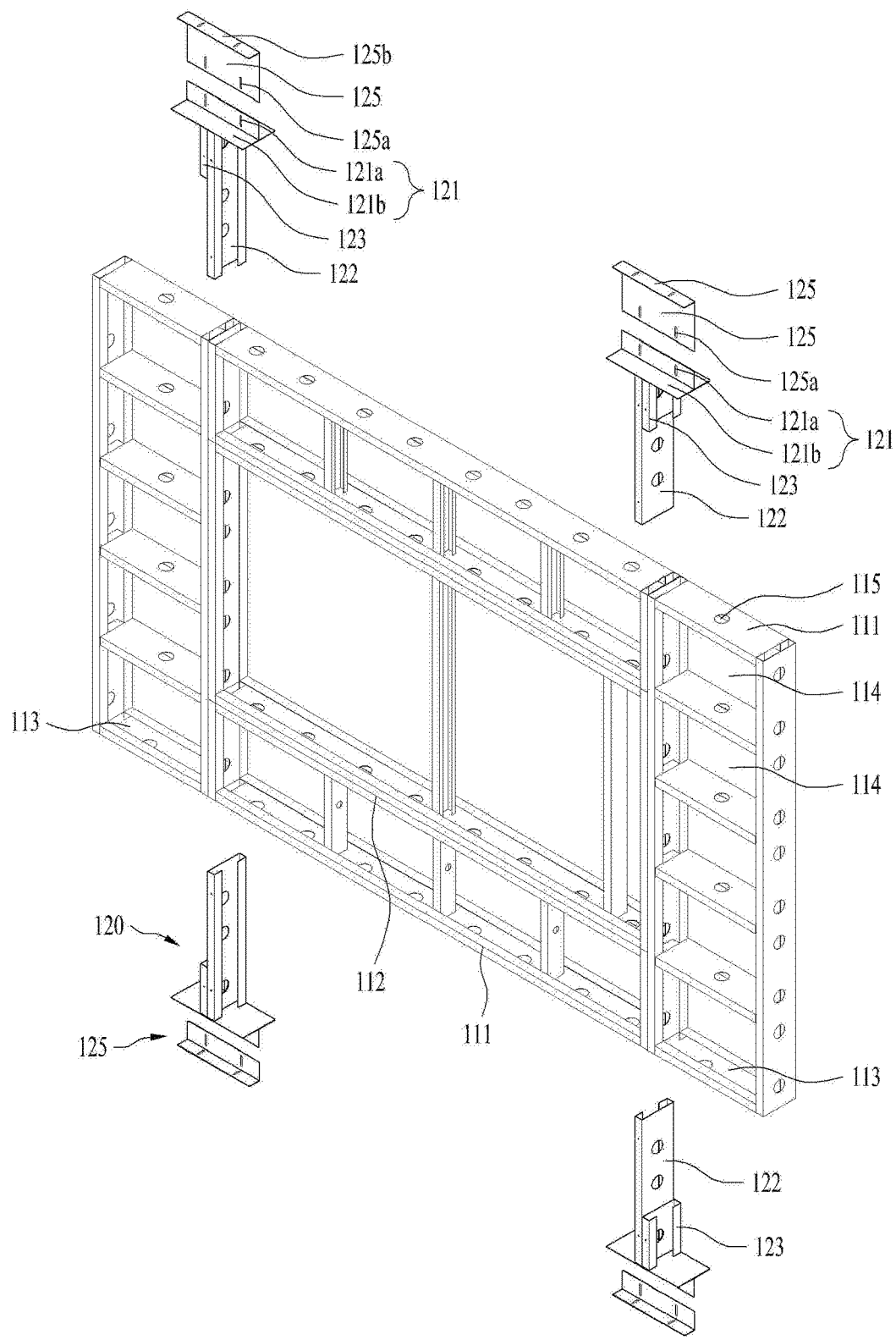
FIG. 7 is a view illustrating a method of installing a frame structure of the media wall according to an embodiment of the present disclosure.

FIG. 7 is a view illustrating a method of installing a frame structure 110 of the media wall 100 according to an embodiment of the present disclosure. The frame structure 110 formed by fastening the frame modules 111, 112, and 113 may be fixed to the ceiling and the floor so as to be installed in an indoor space.

The fixing bracket 125, which is installed on the ceiling or the floor, is a member bent in an L shape. One side 125*b* of the fixing bracket 125 is disposed on the ceiling or the floor, and the opposite side 125*a* thereof vertically extends from the ceiling or the floor. The frame structure may include a first vertical bracket 122 inserted into an internal space of the vertical steel thereof.

The first vertical bracket 122 may be formed to be longer than the vertical length of the first frame module 111 to fasten not only the first frame module 111 but also the second frame module 112. The frame structure may further include a second vertical bracket 123 disposed in parallel with the first vertical bracket 122 and inserted into the third frame module 113. Since the vertical steel of the third frame module 113 is one member, the vertical steel does not need to be as long as the first vertical bracket 122.

A coupling bracket 121 may be coupled to an end of each of the first vertical bracket 122 and the second vertical bracket 123 to form a T-shape together with the vertical brackets 122 and 123. The coupling bracket 121 may include a seating portion 121*b* coupled to the vertical brackets 122 and 123 and seated on the top surfaces of the first frame module 111 and the third frame module 113, and a fastening portion 121*a* vertically extending from the seating portion 121*b* and fastened to the fixing bracket 125. The coupling bracket 121 and the fixing bracket 125 may be fastened to each other using a screw, and may each have a fastening hole, which the screw is fastened. The fastening hole may be vertically elongated such that the brackets may be adjusted according to the ceiling height.

When the media wall 100 is installed on the existing wall, a fixing member 120 may be further provided to fasten the media wall to the existing wall.

A sound device such as the loudspeaker 162 is positioned on the media wall 100. Accordingly, when the media wall 100 is used as a temporary wall, spaces separated by the wall are formed. In this case, the media wall 100 may be fixed by adding a soundproof structure to prevent sound from leak to the two spaces through the ceiling, the floor, and the sidewalls which are in contact with the media wall 100.

Figure 8:
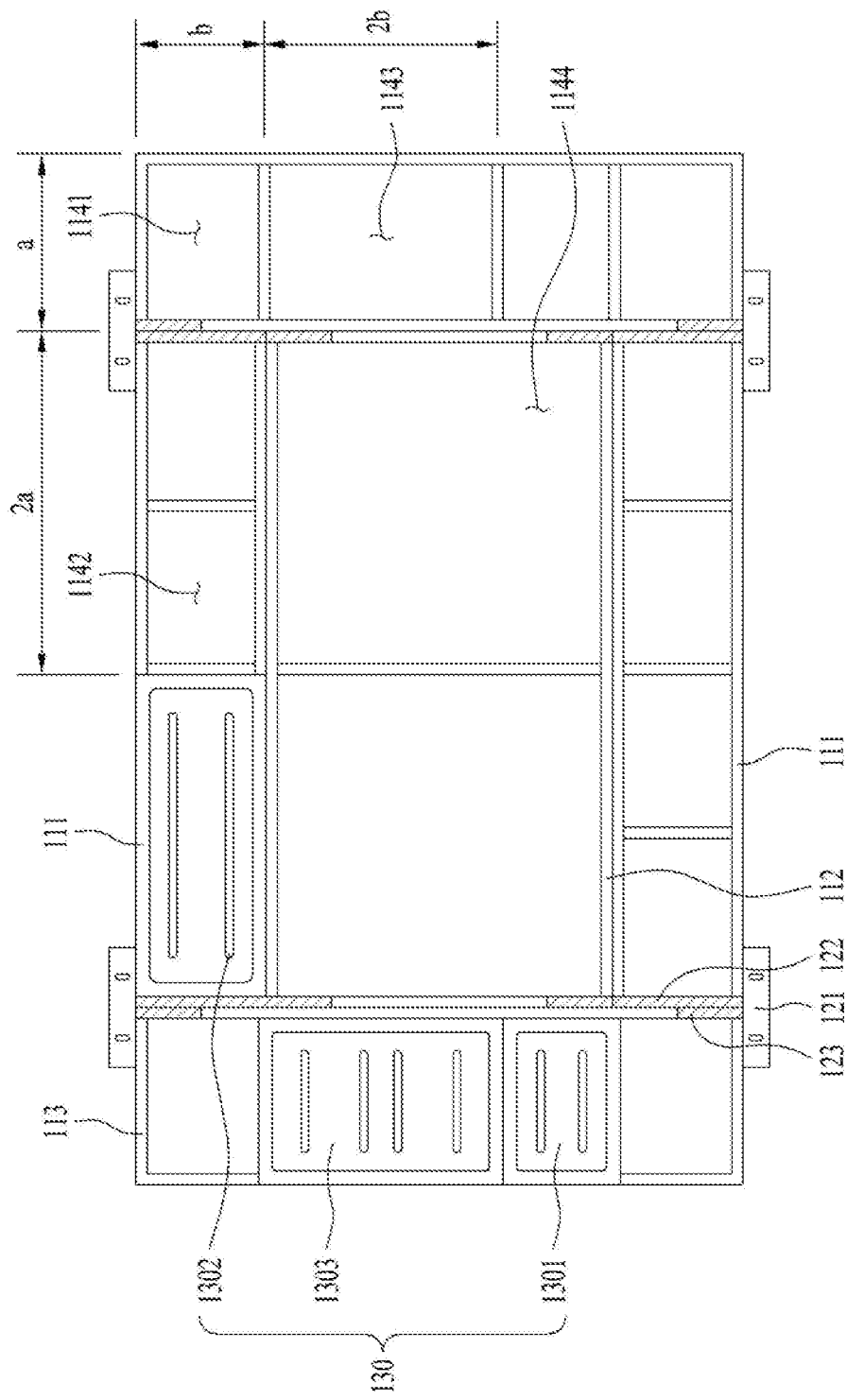
FIG. 8 is a view illustrating a basket of the media wall according to an embodiment of the present disclosure.

FIG. 8 is a view illustrating a basket 130 of the media wall 100 according to an embodiment of the present disclosure. The frame modules 111, 112, and 113 may be divided into a plurality of mounting cells 114 using the inner shape steel 115. As shown in FIG. 7, the basket 130 may be inserted into the mounting cells 114 to provide a space in which the electronic appliance 160 is seated. The second frame module 112 has a relatively large mounting cell 114 because the display device 161 is located therein. On the other hand, the mounting cells 114 of the first frame module 111 and the third frame module 113 may be formed to have standardized sizes. Using the mounting cells 114 of the standardized sizes, the basket 130 may also be standardized. Accordingly, there is no need to manufacture various different shapes of parts.

However, forming the mounting cells to have the same size may be favorable to standardization, but a larger cell may be needed depending on the electronic appliance 160 to be mounted. For example, since the size of the air conditioner is different from that of the air cleaner, the mounting cell 114 may be formed to have a size which is an integer multiple of a base size in consideration of the difference in size. For example, based on a first mounting cell 1141 having a horizontal dimension equal to a and a vertical dimension equal to b, a second mounting cell 1142 having a horizontal dimension equal to an integer multiple of a or a third mounting cell 1143 having a vertical dimension equal to an integer multiple of b may be provided.

The horizontal dimension of the first mounting cell 1141 corresponds to the horizontal dimension of the third frame module 113, and the vertical dimension thereof corresponds to the vertical dimension of the first frame module 111. Here, the mounting cell 114 refers to an internal space partitioned by the shape steel 115, and thus the difference in size between the first frame module 111 and the third frame module 113 caused by the thickness of the shape steel 115 is ignored.

Since the first frame module 111 has a short vertical length, the first frame module 111 may include only the first mounting cell 1141 and the second mounting cell 1142.

Since the third frame module 113 has a short horizontal length, the third frame module 113 may include only the first mounting cell 1141 and the third mounting cell 1143.

FIG. 9 is a view illustrating change of a screen view according to the size of the display device 161 exposed through the front of the media wall 100 according to an embodiment of the present invention. Only half of the display device 161 may be exposed to provide necessary information to the user as shown in FIG. 9(a), or a small part of the display device may be exposed in normal times to obtain the interior effect as shown in FIG. 9(b).

The media wall 100 of the present disclosure may include a screen 200 configured to cover the front surface of the display device 161. The screen 200 may be formed of a material that may be wound around a roll, such as a fabric material. The screen 200 serves to cover the front surface of the display device 161 such that the display device 161 is not exposed to the outside when the display device 161 is not used.

The screen 200 may be wound around a drive roller 210 to adjust the area of a first region 200a of the screen 200 positioned on the front surface of the display device 161. When the screen 200 is wound around the drive roller 210 by a large number of turns, the area of the first region 200a is reduced and the front surface of the display device 161 is exposed.

The screen 200 may be wound around the drive roller 210 by half a turn, such that a part (the first region 200a) of the screen 200 is positioned on the front surface of the display device 161, and the other part (a second region 200b) of the screen 200 is positioned on the rear surface of the display device 161. Increasing the area of the second region positioned on the rear surface of the display device 161 reduces the area of the first region positioned on the front surface of the display device 161. Accordingly, the area of the display device 161 exposed through the front may be adjusted by adjusting the areas of the first region 200a and the second region 200b.

The controller 180 may adjust the rotation direction of the drive roller 210 to adjust the area of the screen 200 positioned on the front surface of the display device 161, and may stop rotating the drive roller 210 when the screen 200 reaches a preset position.

The controller 180 may control an image output to the display device 161 according to the position of the screen 200. For example, in a line view mode as shown in FIG. 9(a) or a half view mode as shown in FIG. 9(b), an image is output only to a part of the display device 161 that is not covered by the screen. The media wall may further include a sensor 200 configured to sense the position of the screen 200 in order to more accurately specify the position of the screen 200 and the range of an output region of the display device 161.

Figure 11:
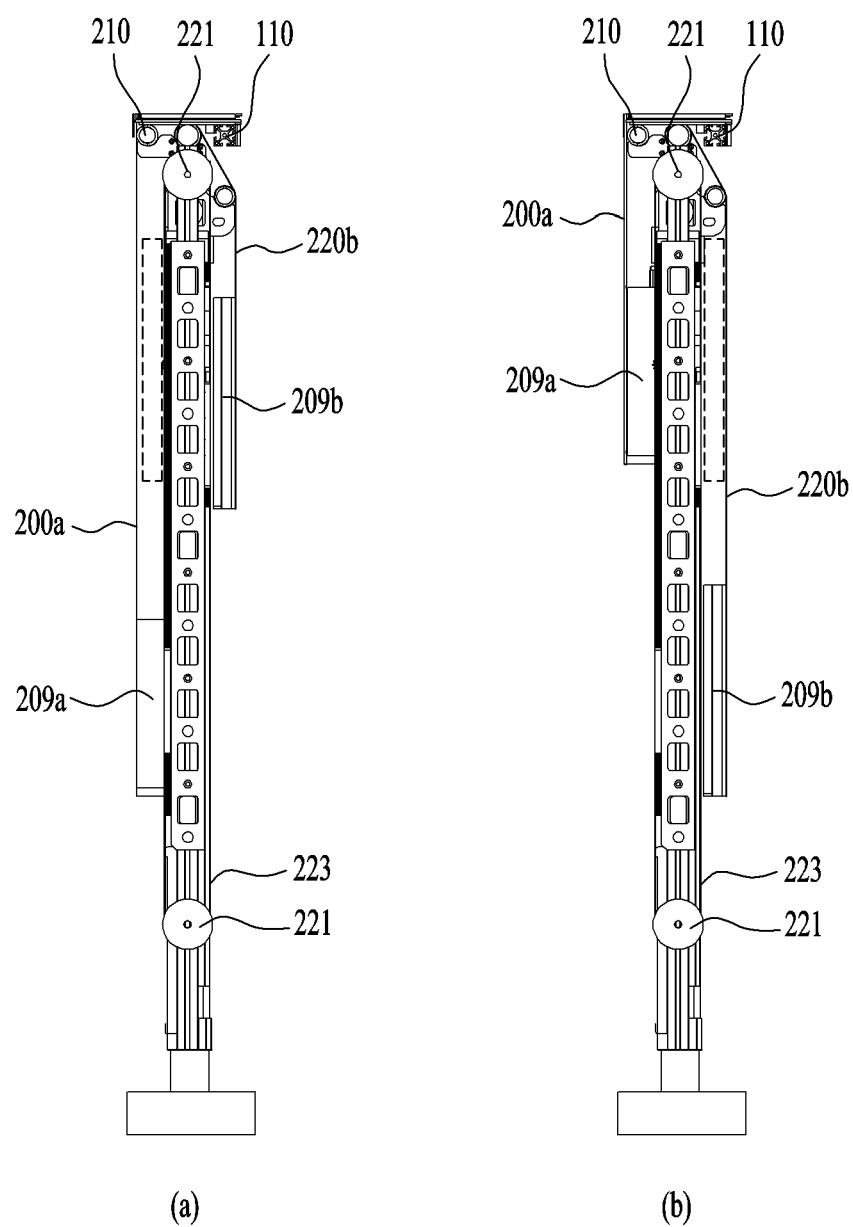
FIG. 11 is cross-sectional views taken along lines A-A and B-B of FIG. 10 with the protruding frame omitted.

FIG. 10 is a view illustrating operation of the screen 200 of the media wall, and FIG. 11 is cross-sectional views taken along lines A-A and B-B of FIG. 10. The state in which the area of the first region 200a of the screen 200 is increased to cover the entire display screen of the display device 161 disposed in the mounting cell as shown in FIG. 10(a) is referred to as a first state. A state in which the area of the first region 200a of the screen 200 is reduced to expose the entire display screen of the display device 161 disposed in the mounting cell as shown in FIG. 10(b) is referred to as a second state.

The screen 200 is wound around the drive roller 210 located above the screen and is moved by rotation of the drive roller 210. The sum of the areas of the first region 200a and the second region 200b is constant as the area of the entire screen 200. As shown in FIGS. 10(a) and 11(a), when the area of the first region 200a is increased and set in the first state, the area of the second region 200b positioned opposite to the first region 200a is reduced. On the contrary, as shown in FIGS. 10(b) and 11(b), when the area of the first region 200a is reduced and set in the second state, the area of the second region 200b is increased.

The screen plates 209a and 209b coupled to lower ends of the first region 200a and the second region 200b may be provided to ensure stable movement of the screen 200. The screen plates 209a and 209b may have a predetermined weight like metal, and may thus apply pulling force to the screen 200 of a fabric material downward and keep the screen 200 flat. In addition, the screen plates may extend to a length corresponding to the size of the screen 200 to prevent the screen 200 from warping in the lateral direction. The screen plate 209a, 209b includes a member having rigidity. Accordingly, the screen plates are not wound on the drive roller 210, but are always positioned on the front side. As shown in FIG. 11(b), the vertical length of a first screen plate 209a is limited to a value less than or equal to the length of the upper portion of the display device 161 so as not to cover the display device 161 in the second state.

As shown in FIG. 11(a), in the first state, the portion of the screen positioned between the screen plates 209a and 209b and the drive roller 210 is spaced apart from the frame structure 110 or the display device 161, thereby defining an empty space A. Due to the empty space, the screen 200 may be shaken or twisted, and thus may look very different from the art wall therearound. When a display is disposed even on the other side of the media wall and the second region 200b is exposed to the outside, the second region 200b between the second screen plate 209b and the drive roller 210 is similarly spaced apart from the frame structure or the display device, thereby defining an empty space B, as shown in FIG. 11(b).

Figure 13:
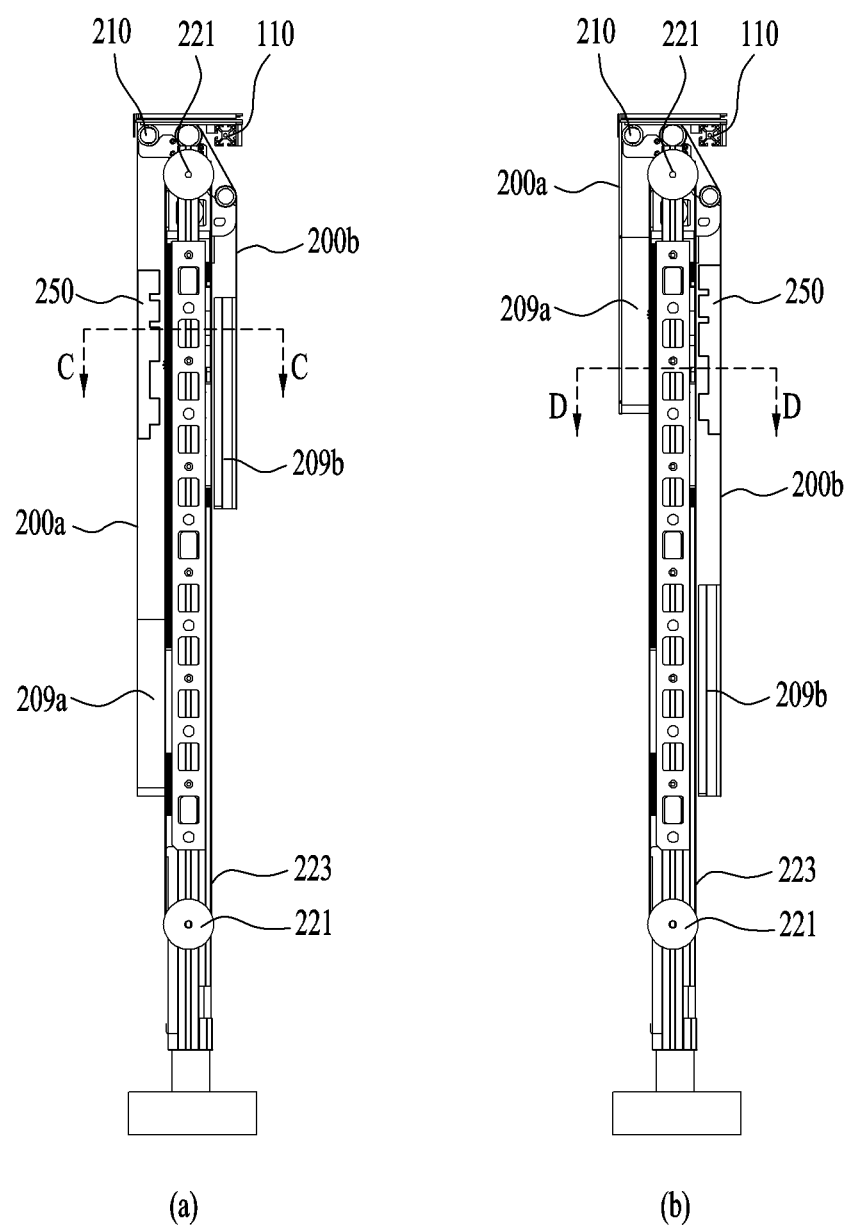
FIG. 13 is cross-sectional views taken along lines A-A and B-B of FIG. 10.

In order to address the above-mentioned issue, the media wall may further include a protruding frame 250 configured to fill the empty spaces A and B. FIG. 12 is a view illustrating the frame structure 110 and the protruding frame 250, which are exposed by removing the screen in the state of FIG. 10, and FIG. 13 is cross-sectional views taken along lines A-A and B-B of FIG. 10. The protruding frame 250 may fill the empty space while moving in the mounting cell in a thickness direction, that is, a back-and-forth direction.

As shown in FIG. 12(a), in the first state, the protruding frame may protrude forward to contact the inner surface of the first region 200a of the screen 200. In the second state, the protruding frame may overlap the first screen plate 209a, and thus may move backward to provide a space in which the first screen plate 209a may be positioned on an upper portion of the display device 161.

When the first screen plate 209a is moved while being spaced apart from the frame structure 110, the first screen plate 209a may be shaken in the back-and-forth direction. In addition, when the user pushes the screen 200, the screen 200 and the first screen plate 209a may be moved backward. When the first screen plate 209a and the second screen plate 209b are formed to have a thickness corresponding to the gap between the screen 200 and the frame structure 110, the first screen plate and the screen may vertically move without shaking.

In this case, the protruding frame 250 may protrude forward by a distance corresponding to the thickness of the first screen plate 209a. In the second state, when the protruding frame 250 moves backward, the protruding frame 250 may contact the inner surface of the second region 200*b*, thereby filling the empty space B between the second region 200*b* and the frame structure 110.

To allow the screen 200 to more stably move with a predetermined distance maintained between the first screen plate 209*a* and the frame structure 110, a guide rail along which the screen moves may be provided to the vertically extending frame. In addition, a movement guide extending from the first screen plate 209*a* and inserted into the guide rail may be provided. Thus, the screen 200 may be moved with a predetermined distance corresponding to the length of the movement guide maintained between the screen 200 and the frame structure 110.

Alternatively, as shown in FIG. 13, a pair of rotating pulleys 221 may be disposed on upper and lower sides, and a timing belt 223 may be arranged to surround the rotating pulleys 221. A movement guide extending from the first screen plate 209*a* may be coupled to the timing belt 223. Thus, when the timing belt 223 moves in a vertical direction, the first screen 200 may also move in the vertical direction. In this operation, the motor may rotate the rotating pulley 221, rather than directly transmitting the rotational force to the drive roller 210. Then, the driving force may be transmitted via the timing belt 223, the movement guide, and the first screen plate 209*a*.

When the second screen plate 209*b* coupled to the second region 200*b* is also coupled to the timing belt via the movement guide, the first region 200*a* and the second region 200*b* are moved simultaneously in opposite directions in synchronization with each other, and therefore the screen 200 may be moved stably.

A contact surface of the protruding frame 250, which is arranged to contact the first region 200*a*, may be elongated in the horizontal direction so as to have a length corresponding to the horizontal length of the first region 200*a*. Thus, the protruding frame 250 may stably support the first region 200*a*.

A frame driver configured to move the protruding frame 250 in the back-and-forth direction may be provided. The frame driver may include a frame motor 253 and rack and pinion gears 254 and 255. FIG. 14 is a view illustrating a frame driver. The rack gear 255, which is formed on a bracket 252 fastened to the protruding frame 250, is arranged in the back-and-forth direction of the protruding frame 250, and the pinion gear 254, which is coupled to the frame structure 110, is rotated by the rotational force of the frame motor 253 transmitted thereto. The rack gear 255 may be engaged with the pinion gear 254. Thus, when the pinion gear 254 rotates, the rack gear 255 may linearly move, and the protruding frame 250 may move in the back-and-forth direction.

Figure 15:
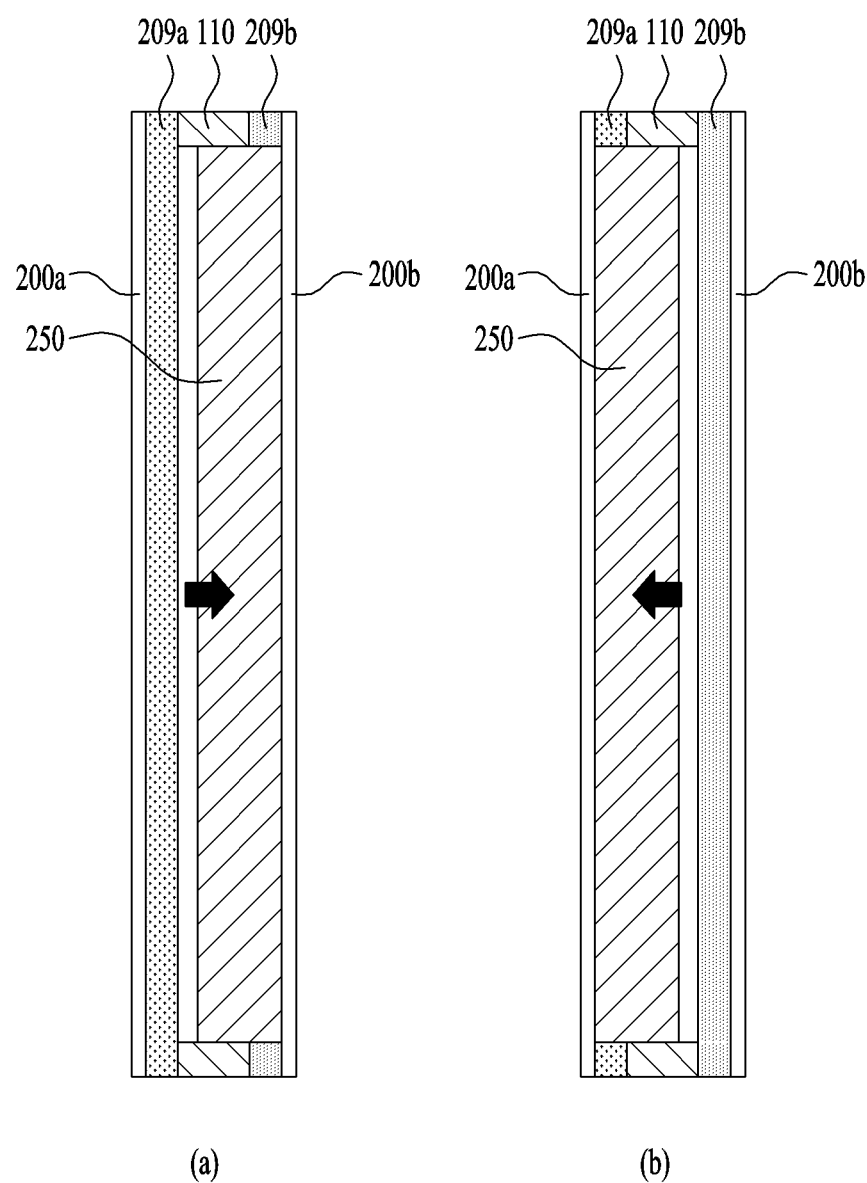
FIG. 15 is cross-sectional views taken along lines C-C and D-D of FIG. 13.

FIG. 15 is cross-sectional views taken along lines C-C and D-D of FIG. 13. The protruding frame 250 may be a hollow frame or may be a solid frame as shown FIG. 15. In the first state, the protruding frame 250 moves forward as shown in FIG. 15(*a*). In the second state, the protruding frame 250 moves backward as shown in FIG. 15(*b*).

Figure 16:
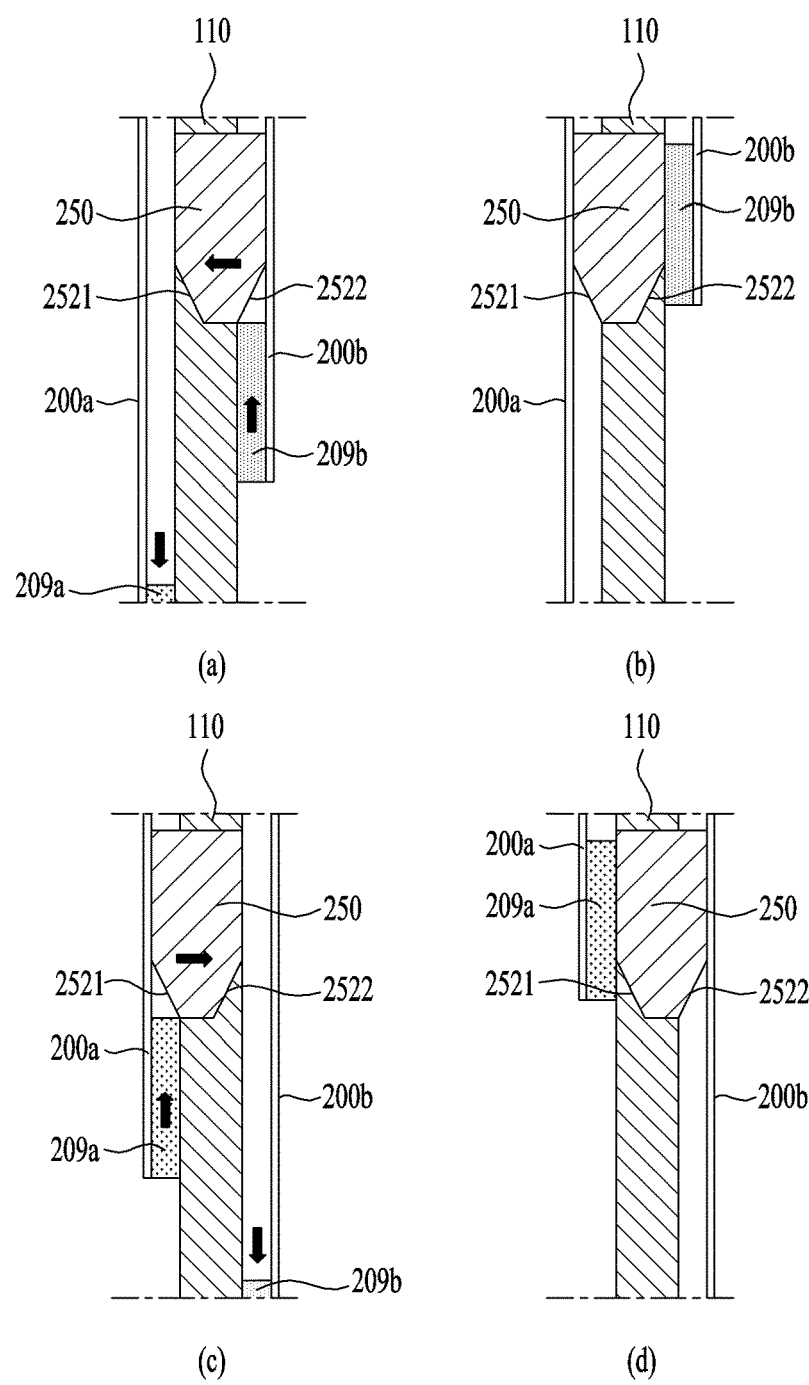
Figure 17:
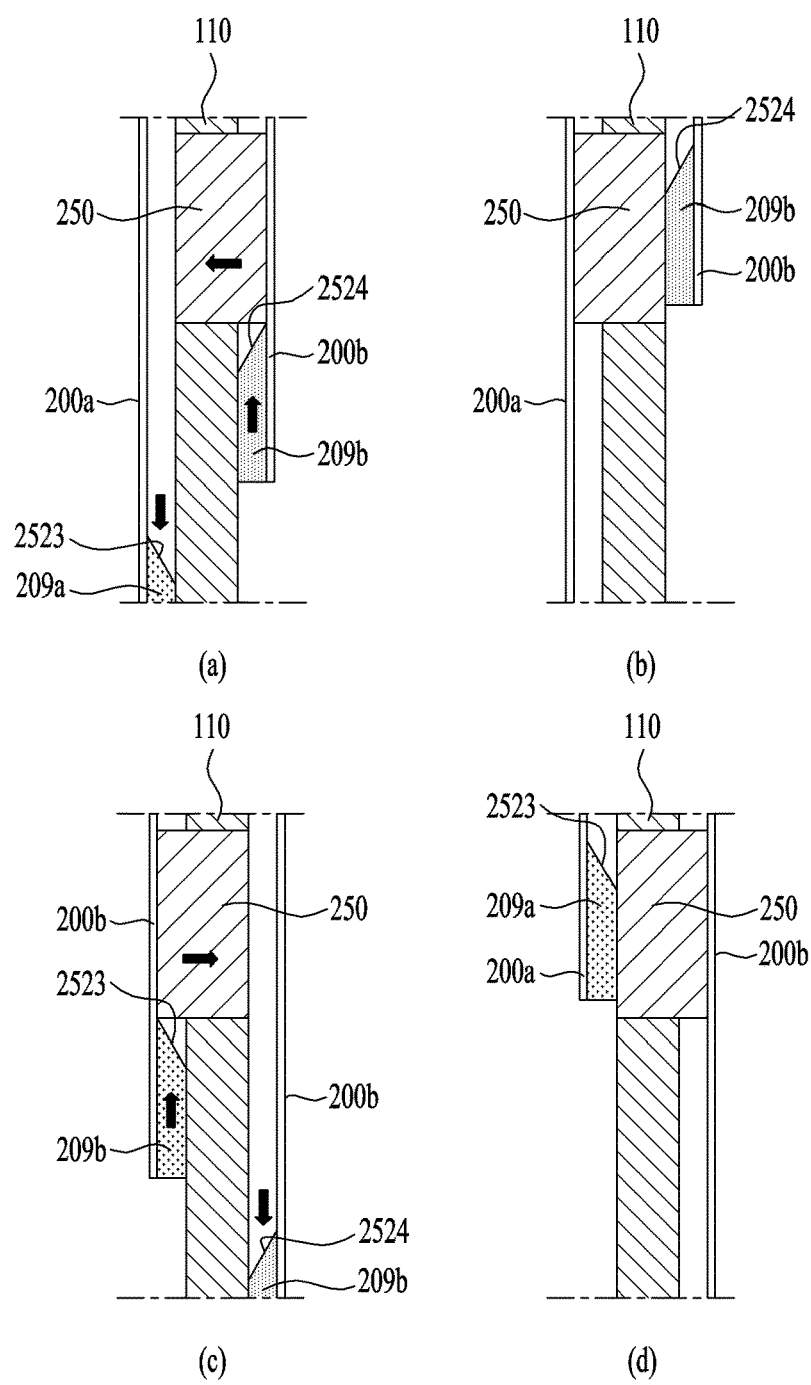

FIGS. 16 to 18 are views illustrating various embodiments of the protruding frame 250 of the media wall. In the example of FIGS. 16 to 18, the protruding frame 250 is automatically moved in the back-and-forth direction according to movement of the screen 200 without a separate frame driver. As shown in FIG. 16, a first inclined surface 2521 and a second inclined surface 2522 may be formed at a lower end of the protruding frame 250. The screen plates 209*a* and 209*b* positioned at the lower ends of the first region 200*a* and the second region 200*b* of the screen 200 may have a predetermined thickness as shown in FIG. 16(*a*). In the process of switching to the first state, the second screen plate 209*b* is brought into contact with the protruding frame 250 protruding toward the region 200*b* as the first region 200*a* moves downward and the second region 200*b* moves upward, as shown in FIG. 16(*a*). When the second screen plate 209*b* is brought into contact with a second inclined surface 2522 at the lower end of the protruding frame 250, the force that moves the second screen plate 209*b* upward is converted into force to move the protruding frame 250 forward. Thus, the protruding frame 250 protrudes forward as shown in FIG. 16(*b*). On the contrary, when the screen is switched from the first state to the second state, the first screen plate 209*a* is moved upward and brought into contact with a first inclined surface 2521 at the lower end of the protruding frame 250, as shown in FIG. 16(*c*). As the first screen plate 209*a* is moved upward, the first screen plate 209*a* may push the protruding frame 250 backward. Then, the protruding frame 250 may come into contact with the second region 200*b* to support the empty space of the second region 200*b*.

The first inclined surface 2521 contacting the first screen plate 209*a* extends rearward as it extends downward, facing the first region 200*a*. The second inclined surface 2522 contacting the second screen plate 209*b* extends forward as it extends downward, facing the second region 200*b*.

In the embodiment of FIG. 17, a third inclined surface 2523 and a fourth inclined surface 2524 facing the protruding frame 250 is formed on each of the top sides of the first screen plate 209*a* and the second screen plate 209*b*. In the process of switching to the first state, a fourth inclined surface 2524 positioned on the upper portion of the second screen plate 209*b* is brought into contact with the protruding frame 250 moved toward the second region 200*b* as the first region 200*a* moves downward and the second region 200*b* moves upward, as shown in FIG. 17(*a*). The protruding frame 250 contacting the third inclined surface 2523 may move forward to support the back of the first region 200*a* as shown in FIG. 17(*b*).

On the contrary, when the screen is switched to the second state, the first screen plate 209*a* may move upward, and the third inclined surface 2523 of the first screen plate 209*a* may come into contact with a lower portion of the protruding frame 250 and push the protruding frame 250 backward, as shown in FIG. 17(*c*). Then, as shown in FIG. 17(*d*), the protruding frame 250 may come into contact with the inner side of the second region 200*b*, thereby switching the screen to the second state.

In this way, the force to move the screen 200 in the vertical direction may be produced through the inclined surface, and therefore the frame driver may be omitted.

The protruding frame 250 should be positioned above the display device 161 so as not to be exposed to the outside even when the screen 200 is in the first state. A gap may be formed between the protruding frame 250 and the first screen plate 209*a* because a structure to closely contact and support the first region 200*a* of the screen 200 is not present. In order to address this issue, as illustrated in FIG. 18, the protruding frame 250 may be extended downward to support a screen portion positioned in front of the display device 161.

As illustrated in FIGS. 18(*a*) and 18(*b*), the protruding frame 250 may include an extension frame 253 extending downward. As shown in FIGS. 18(*c*) and 18(*d*), the extension frame 253 may have a comb structure having teeth misaligned with each other so as to be positioned in the same place as the protruding frame 250 to support the first region 200a of the screen 200. The extension frame may increase the area to support the rear surface of the first region 200a, and therefore contribute to keeping the screen 200 flat.

As is apparent from the above, a media wall according to the present disclosure may be installed on a wall at the same height as a multimedia device such as a TV or an audio device mounted thereon and may cover the electronic appliances with the screen 200 when the electronic appliances are not in use. Thereby, the media wall may provide a tidy appearance.

As the screen 200 to selectively expose the display device 161 according to a usage status of the display device 161 is used, a tidier appearance may be provided.

The above embodiments should be construed in all aspects as illustrative and not restrictive. The scope of the disclosure should be determined by the appended claims and their legal equivalents, and all changes coming within the meaning and equivalency range of the appended claims are intended to be embraced therein.

What is claimed is:

1. A media wall comprising:
    a frame structure comprising a mounting cell;
    an electronic appliance disposed in the mounting cell;
    a drive roller arranged above the mounting cell;
    a screen wound around the drive roller by half a turn, the screen comprising a first region positioned in front of a front side of the electronic appliance and a second region positioned behind a rear side of the electronic appliance, wherein a sum of areas of the first region and the second region is constant as an area of the entire screen;
    a motor configured to provide rotational force to the drive roller to vary the area of the first region of the screen; and
    a protruding frame introduced into and drawn out of the mounting cell in a back-and-forth direction perpendicular to a surface of the first or second regions,
    wherein, when the screen is in a first state, the first region is widened to cover the front side of the electronic appliance, and the protruding frame protrudes forward and contacts an inner surface of the first region of the screen, and
    wherein, when the screen is in a second state, the first region is narrowed to expose the front side of the electronic appliance, and the protruding frame retreats rearward and is spaced apart from the first region and contacts an inner surface of the second region.

2. The media wall of claim 1, wherein the frame structure comprises a vertical frame positioned on left and right sides of the mounting cell,
    the media wall further comprising:
    a frame motor positioned on the vertical frame;
    a pinion gear configured to be rotated by rotational force of the frame motor transmitted thereto; and
    a rack gear formed on the protruding frame and configured to rotate in engagement with the pinion gear.

3. The media wall of claim 1, further comprising:
    a first screen plate positioned at a lower end of the first region of the screen.

4. The media wall of claim 3, further comprising:
    a guide rail formed on the frame structure and extending in a vertical direction; and
    a movement guide extending from the first screen plate and configured to move along the guide rail.

5. The media wall of claim 3, wherein the first screen plate has a thickness corresponding to a distance between the frame structure and the screen.

6. The media wall of claim 5, wherein, when the screen is switched from the first state to the second state, the protruding frame moves rearward a distance greater than or equal to the thickness of the first screen plate.

7. The media wall of claim 5, further comprising:
    a second screen plate having a thickness corresponding to the distance between the frame structure and the screen and positioned at a lower end of the second region.

8. The media wall of claim 7, wherein the protruding frame comprises a first inclined surface facing the first screen plate and a second inclined surface facing the second screen plate, the first inclined surface and the second inclined surface being formed at a lower end of the protruding frame,
    wherein, when the first region is narrowed and an upper end of the first screen plate comes into contact with the first inclined surface, the protruding frame is moved rearward, and
    wherein, when the second region is narrowed and an upper end of the second screen plate comes into contact with the second inclined surface, the protruding frame is moved forward.

9. The media wall of claim 7, further comprising:
    a third inclined surface provided to an upper end of the first screen plate, the third inclined surface extending downward and rearward; and
    a fourth inclined surface provided to an upper end of the second screen plate, the fourth inclined surface extending downward and forward,
    wherein, when the first region is narrowed and a lower end of the protruding frame comes into contact with the third inclined surface, the protruding frame is moved rearward, and
    wherein, when the second region is narrowed and the lower end of the protruding frame comes into contact with the fourth inclined surface, the protruding frame is moved forward.

10. The media wall of claim 1, wherein the protruding frame further comprises an extension frame extending downward in the first state.

11. The media wall of claim 1, wherein the protruding frame has a width corresponding to a horizontal width of the screen.

* * * * *